United States Patent
Nagashima

(10) Patent No.: US 10,084,484 B2
(45) Date of Patent: Sep. 25, 2018

(54) STORAGE CONTROL APPARATUS AND NON-TRANSITORY COMPUTER-READABLE STORAGE MEDIUM STORING COMPUTER PROGRAM

(71) Applicant: FUJITSU LIMITED, Kawasaki-shi, Kanagawa (JP)

(72) Inventor: Katsuhiko Nagashima, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 48 days.

(21) Appl. No.: 15/163,744

(22) Filed: May 25, 2016

(65) Prior Publication Data

US 2016/0365874 A1  Dec. 15, 2016

(30) Foreign Application Priority Data

Jun. 15, 2015 (JP) ................................ 2015-119870

(51) Int. Cl.
| | | |
|---|---|---|
| *G11C 29/00* | (2006.01) | |
| *H03M 13/29* | (2006.01) | |
| *G06F 11/10* | (2006.01) | |
| *G06F 3/06* | (2006.01) | |

(52) U.S. Cl.
CPC ...... *H03M 13/2906* (2013.01); *G06F 3/0608* (2013.01); *G06F 3/0641* (2013.01); *G06F 11/1076* (2013.01)

(58) Field of Classification Search
None
See application file for complete search history.

(56) References Cited

U.S. PATENT DOCUMENTS

| | | | | |
|---|---|---|---|---|
| 2009/0083563 A1* | 3/2009 | Murase | ................. | G06F 1/3268 713/324 |
| 2010/0205390 A1* | 8/2010 | Arakawa | ............... | G06F 3/0607 711/162 |
| 2010/0318887 A1* | 12/2010 | Zvibel | ................. | G06F 11/1076 714/819 |
| 2012/0079223 A1* | 3/2012 | Jaquette | .............. | G06F 11/2094 711/162 |

(Continued)

FOREIGN PATENT DOCUMENTS

| | | |
|---|---|---|
| EP | 2042980 A2 | 4/2009 |
| JP | 8-116274 | 5/1996 |
| JP | 2013-532853 | 8/2013 |

OTHER PUBLICATIONS

Extended European Search Report dated Nov. 4, 2016 for corresponding European Application Patent No. 16171907.5, 5 pages.

*Primary Examiner* — Daniel McMahon
(74) *Attorney, Agent, or Firm* — Fujitsu Patent Center

(57) ABSTRACT

A storage control apparatus obtains first-code attached data, each having target data to be written and first code information, which includes an error detection code based on the target data and information about a first write destination, attached to the target data. The storage control apparatus then obtains the target data by excluding the first code information from the first-code attached data eliminates duplication of the target data, generates second code information which includes an error detection code for the target data remaining and information about a second write destination, and writes second-code attached data including the second code information into a memory device.

6 Claims, 13 Drawing Sheets

(56) References Cited

U.S. PATENT DOCUMENTS

| | | |
|---|---|---|
| 2012/0102260 A1 | 4/2012 | Kawamura et al. |
| 2013/0061013 A1* | 3/2013 | Tokoro ................ G06F 11/1076 |
| | | 711/162 |
| 2013/0283058 A1 | 10/2013 | Fiske et al. |
| 2013/0305003 A1 | 11/2013 | Matsushita et al. |
| 2015/0161000 A1 | 6/2015 | Kim et al. |
| 2016/0226725 A1* | 8/2016 | Iizuka .................... H04L 69/22 |

\* cited by examiner

STORAGE CONTROL APPARATUS AND NON-TRANSITORY COMPUTER-READABLE STORAGE MEDIUM STORING COMPUTER PROGRAM

CROSS-REFERENCE TO RELATED APPLICATION

This application is based upon and claims the benefit of priority of the prior Japanese Patent Application No. 2015-119870, filed on Jun. 15, 2015, the entire contents of which are incorporated herein by reference.

FIELD

The embodiments discussed herein relate to a storage control apparatuse and a non-transitory computer-readable storage medium storing a computer program.

BACKGROUND

In recent years, a storage system is widely used which achieves an improvement in the reliability of data and an increase in capacity by causing a plurality of HDDs (Hard Disk Drives) and/or SSDs (Solid State Drives) to have a redundant configuration using a RAID (Redundant Arrays of Inexpensive Disks) technique or the like. Moreover, in order to improve the reliability of data, an error detection code (e.g., CRC (Cyclic Redundancy Check) code) is also added to the data to be written into a memory device, such as an HDD and/or an SSD. The reliability of a storage system is maintained by such techniques.

While the capacity of a memory device is also increasing with a development in technology, the amount of data used by a user is also rapidly increasing. Therefore, techniques are under study for reducing the amount of data to be written into a memory device. A technique called de-duplication has been developed as one of the techniques. This technique is for identifying, among the data to be written into a memory device or the data already written in a memory device, a plurality of data portions (chunks) each having a duplicated content and then leaving one identified chunk and removing the other chunks each having the content that overlaps with that of the identified chunk.

In removing the other chunks, the storage system generates information (reparse point) indicative of a relationship between the remaining chunk and the other chunks. Then, upon receipt of a read request for the other chunks, the storage system identifies the remaining chunk based on the reparse point and responses using the identified chunk. Application of this de-duplication enables the capacity of a memory device to be efficiently utilized. Moreover, in a memory device, like an SSD, having a limited number of times of rewriting, the de-duplication contributes to a reduction of the number of times of rewriting.

As described above, in order to improve the reliability of data, a check code including a CRC code and the information indicative of the write destination of data may be added to the data to be written into a memory device. As the techniques for performing the de-duplication on such check-code attached data, a technique has been proposed for separating the check code from the data, performing de-duplication, and then concatenating the check code, which is separated prior to the de-duplication, to the de-duplicated data and writing the resulting data into a memory device.

Note that, with regard to the CRC code, a technique has been proposed for generating a CRC code from the data prior to compression, and generating a dummy code so that this CRC code matches a CRC code that is generated from the compressed data with a dummy code added thereto. In this technique, together with the compressed data, a dummy code and a CRC code generated from the data prior to compression are written into a memory device.

See, for example, Japanese National Publication of International Patent Application No. 2013-532853 and Japanese Laid-open Patent Publication No. 08-116274.

A CRC code generated from the same data has the same value and the check code includes the information about the write destination of the data. The write destination often differs even if the content of the data is the same, and therefore if attempting to de-duplicate the data including the check code, the amount of data to be able to be removed will decrease. Therefore, a method is effective, in terms of increasing the utilization efficiency of a memory area, for performing de-duplication after separating the check code.

However, the data remaining after de-duplication may be compressed and then written into a memory device. In this case, even if the check code separated in de-duplication is concatenated to compressed data and written into a memory device, the check code may not be used in determining an error that occurs in the compressed data. Accordingly, the reliability will decrease. On the other hand, the above-described technique involved in the method for generating a dummy code does not take the de-duplication into consideration at all.

Therefore, not limited to the compression, in cases where a storage system makes any change to the de-duplicated data, it is effective, in terms of maintaining the reliability of the storage system, to provide a mechanism for assuring the reliability of the changed data.

SUMMARY

According to an aspect, there is provided a storage control apparatus including a processor configured to perform a procedure including: obtaining a plurality of pieces of first-code attached data, each having target data to be written and first code information, the first code information including an error detection code based on the target data and information about a first write destination and being attached to the target data; obtaining a plurality of pieces of target data by excluding the first code information from the obtained plurality of pieces of first-code attached data; eliminating duplication of the obtained plurality of pieces of target data; generating second code information which includes an error detection code and information about a second write destination, for each piece of remaining target data remaining after the eliminating; and writing second-code attached data including the second code information into a memory device.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
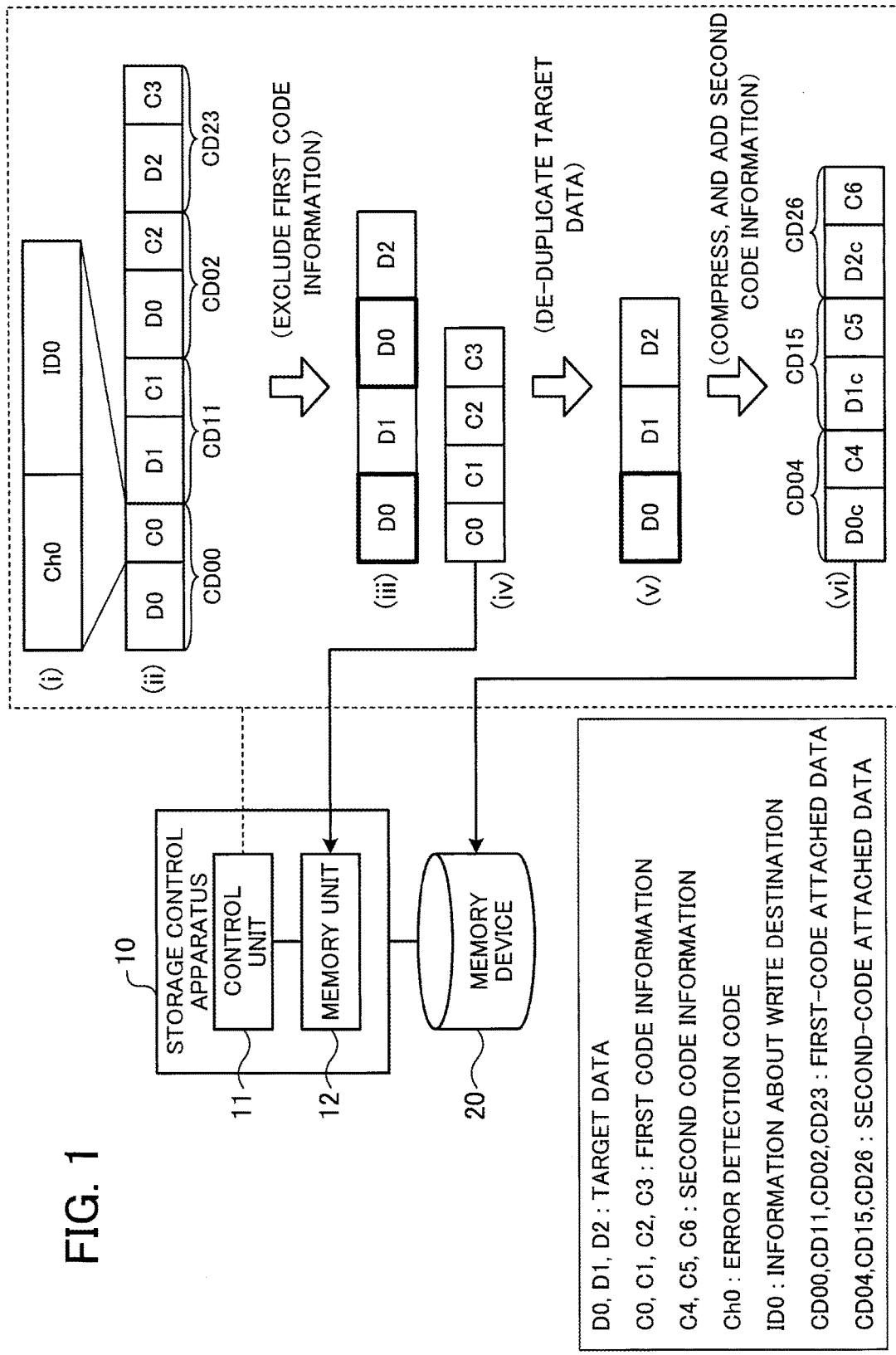
FIG. 1 illustrates an example of a storage control apparatus according to a first embodiment.

Hereinafter, embodiments will be described with reference to the accompanying drawings. Note that, in this specification and the attached drawings, an element having substantially the same function may be given the same reference numeral to omit the duplicated description.

<1. First Embodiment>

A first embodiment will be described with reference to FIG. 1. FIG. 1 illustrates an example of a storage control apparatus according to the first embodiment. The first embodiment relates to the de-duplication of data to which code information used for error detection is added, and provides a storage system which improves the reliability of the de-duplicated data.

A storage control apparatus 10 illustrated in FIG. 1 is an example of the storage control apparatus according to the first embodiment. The storage control apparatus 10 and a memory device 20 serve as a storage apparatus which performs the read/write of data from/to the memory device 20 in response to read/write instructions received from a host computer (non-illustrated), such as a server. This storage apparatus including a host computer may be referred to as a storage system.

As illustrated in FIG. 1, the storage control apparatus 10 includes a control unit 11 and a memory unit 12. The storage control apparatus 10 is connected to the memory device 20. The memory device 20 is an HDD or an SSD, for example. The memory device 20 may be a disk array which is constructed by combining a plurality of HDDs and/or SSDs and is made redundant by the RAID technique.

The control unit 11 is a processor, such as a CPU (Central Processing Unit) or a DSP (Digital Signal Processor). However, the control unit 11 may be an electronic circuit, such as an ASIC (Application Specific Integrated Circuit) or an FPGA (Field Programmable Gate Array). The control unit 11 executes, for example, a program stored in the memory unit 12 or another memory. The memory unit 12 is a volatile memory device, such as a RAM (Random Access Memory), or a nonvolatile memory device, such as an HDD or a flash memory.

The control unit 11 obtains first-code attached data CD00, CD11, CD02, and CD23. The first-code attached data CD00, CD11, CD02, and CD23 are target data to be written D0, D1, D0, and D2 with first code information C0, C1, C2, and C3 attached thereto, respectively, as illustrated in (ii) of FIG. 1.

The first code information C0, C1, C2, and C3 include error detection codes based on the target data D0, D1, D0, and D2, respectively, and the information about a first write destination, as illustrated in (i) of FIG. 1.

The first code information C0 includes an error detection code Ch0 and information ID0 about the first write destination.

The error detection code Ch0 is a CRC code calculated from the target data D0. The information ID0 about the first write destination includes the information for identifying the location of a logical unit (LU) in which the target data D0 is written. For example, the information ID0 about the first write destination includes an initial address and/or offset value of a logical area in which the target data D0 is written. Note that, as with the first code information C0, the first code information C1, C2 and C3 also include error detection codes about the target data D1, D2, and D3 and the information about the first write destinations, respectively.

As illustrated in (iii) of FIG. 1, the control unit 11 excludes the first code information C0, C1, C2, and C3 from the first-code attached data CD00, CD11, CD02, and CD23 to obtain the target data D0, D1, D0, and D2, respectively. Note that, as illustrated in (iv) of FIG. 1, the control unit 11 may store the first code information C0, C1, C2, and C3, which are excluded from the first-code attached data CD00, CD11, CD02, and CD23, into the memory unit 12.

The control unit 11 eliminates the duplication of the target data D0, D1, D0, and D2. In the example of FIG. 1, because two pieces of target data D0 obtained from the first-code attached data CD00 and CD02 are duplicated, the control unit 11 leaves one of the two pieces of target data D0 and excludes (deletes) the other. Accordingly, in the example of FIG. 1, only the target data D0, D1, and D2 remain as illustrated in (v) of FIG. 1.

The control unit 11 generates, for the target data D0, D1, and D2 remaining, second code information C4, C5, and C6 including error detection codes and the information about second write destinations, respectively. For example, the control unit 11 compresses the target data D0, D1, and D2 to generate compressed data D0c, D1c, and D2c, respectively, and calculates an error detection code from each of the compressed data D0c, D1c, and D2c. Then, the control unit 11 generates the second code information C4, C5, and C6 each including the calculated error detection code and the information about the second write destination. The information about the second write destination includes the information (e.g., a physical address or the like) for identifying a write location of the memory device 20 at which each of the compressed data D0c, D1c, and D2c is written. For example, the information about the second write destination includes the initial address and/or offset value of a physical area at which each of the compressed data D0c, D1c, and D2c is written. Note that, when the memory device 20 is a RAID device which is a combination of a plurality of HDDs, information which is a combination of the slot number of an HDD and LBA (Logical Block Addressing) of the HDD may be applicable as the information about the second write destination.

The control unit 11 generates second-code attached data CD04, CD15, and CD26 by adding the second code information C4, C5, and C6, which are generated independently of the first code information C0, C1, C2, and C3, to the compressed data D0c, D1c, and D2c, respectively. Then, the control unit 11 writes the second-code attached data CD04, CD15, and CD26 into the memory device 20, as illustrated in (vi) of FIG. 1.

As described above, the first code information is excluded from the first-code attached data prior to de-duplication and then the target data is de-duplicated, so that the duplication of the data may be efficiently eliminated. Moreover, the second code information is newly generated for the de-duplicated target data and then the second-code attached data with this second code information added thereto is written into the memory device 20, thereby enabling a check on whether the data read out from the memory device 20 is correct or not. As the result, this efficient de-duplication may increase the capacity efficiency of the memory device 20 without decreasing the reliability of the storage system.

Note that, in the example of FIG. 1, although the de-duplicated target data is compressed, the technique of the first embodiment may be similarly applied also to a case where only a part of the target data is compressed and/or a case where the content of target data is changed by processing other than compression. That is, the second code information is generated independently of the first code information, and therefore even in the case where a change, which does not always assure the correctness of the target data by the first code information, is applied to the target data, an error in the data written into the memory device 20 may be detected.

In the above, the first embodiment has been described.

<2. Second Embodiment>

Next, a second embodiment will be described. The second embodiment relates to the de-duplication of data to which a check code including a CRC is added, and provides a storage system which improves the reliability of de-duplicated data.

(Efficiency of De-Duplication)

Figure 2:
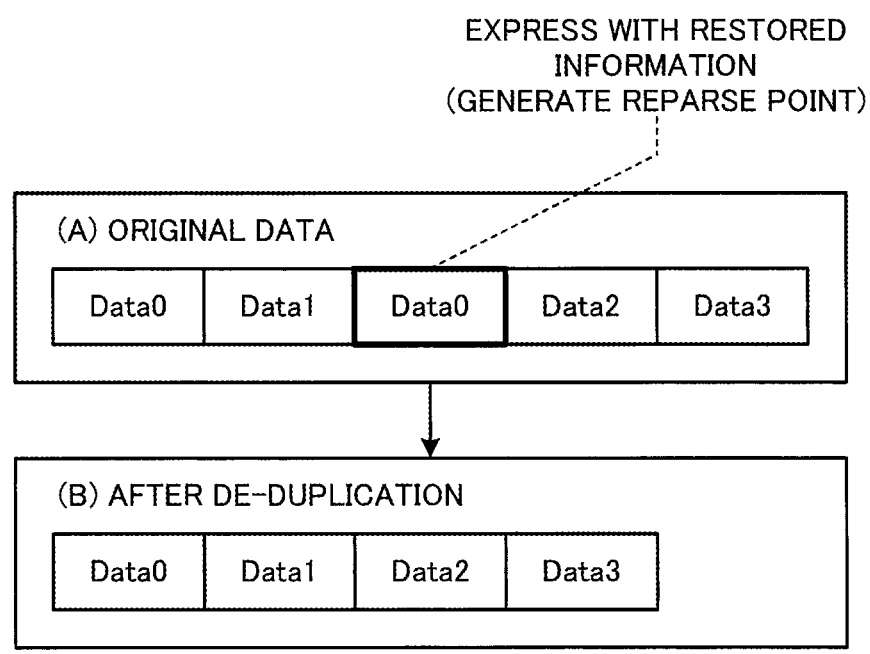
FIG. 2 illustrates de-duplication.

As illustrated in FIG. 2, the de-duplication is a technique for leaving, when there is a plurality of pieces of data each having the same content, one piece of data while deleting the other pieces of data. FIG. 2 illustrates the de-duplication. As one example, (A) of FIG. 2 illustrates original data including Data0, Data1, Data0, Data2, and Data3. In this example, the first and third data from the left are the same Data0, and therefore as illustrated in (B) of FIG. 2, one Data0 is left while another Data0 is deleted by de-duplication.

For the Data0 deleted by the de-duplication, restoration information including the information indicative of a storage location of the remaining Data0 and the like is generated. This restoration information may be referred to as a reparse point. In restoring the original data from the de-duplicated data, the remaining Data0 is obtained based on the restoration information and is used for restoration, instead of the deleted Data0. Use of the de-duplication reduces the amount of data, and enables efficient utilization of the capacity of a memory area where data is stored.

Figure 3:
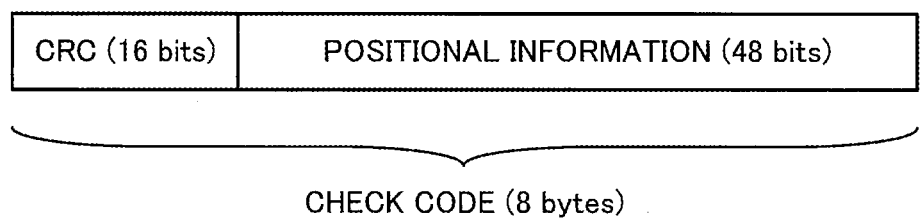
FIG. 3 illustrates a check code.

In a storage system, a check code is added to data in order to improve the reliability of the data. The check code has a structure as illustrated in FIG. 3, for example. FIG. 3 illustrates the check code. As illustrated in FIG. 3, the check code includes a CRC code used for error detection in data and positional information about a storage location of the data. The CRC code is calculated based on the data. The positional information is expressed, for example, by the initial address, offset and the like of an LU serving as the storage location of the data.

Figure 4:
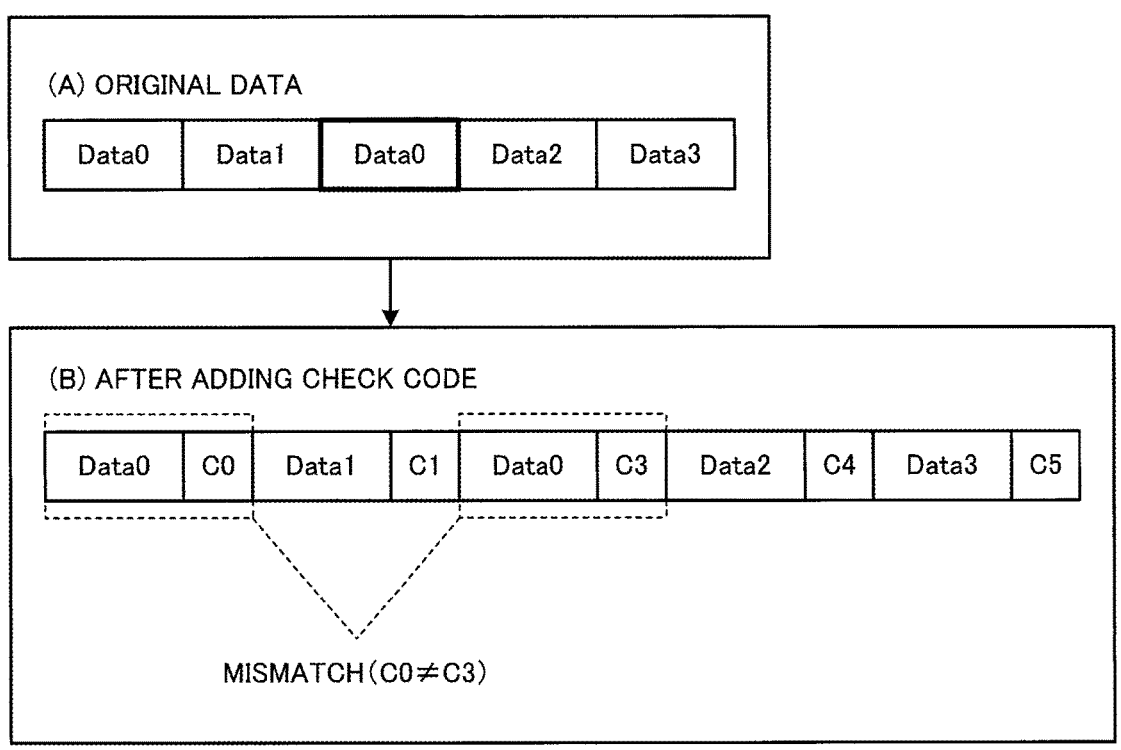
FIG. 4 illustrates the efficiency of de-duplication.

If the content of the data is the same, the CRC code has the same value. On the other hand, with regard to the data to be de-duplicated, even if pieces of data have the same content, the storage locations thereof often differ. Therefore, as illustrated in FIG. 4, in attempting to perform de-duplication on the pieces of data with check codes added thereto, the percentage of the pieces of data which are not deleted because the positional information of the check codes differ will increase. FIG. 4 illustrates the efficiency of de-duplication.

In the example of FIG. 4, the check codes C0, C1, C2, C3, C4, and C5 are added to the original data. When the check codes C0 and C3 include different positional information, the deletion of one of the original Data0 by de-duplication is not performed even if the Data0 is common. However, if the check code is removed, the reliability of data will decrease, and therefore a mechanism is desired to achieve both keeping the reliability by the check code and improving efficiency of a memory area by de-duplication. A second embodiment provides a storage system capable of satisfying these two demands.

(2-1. Storage System)

Figure 5:
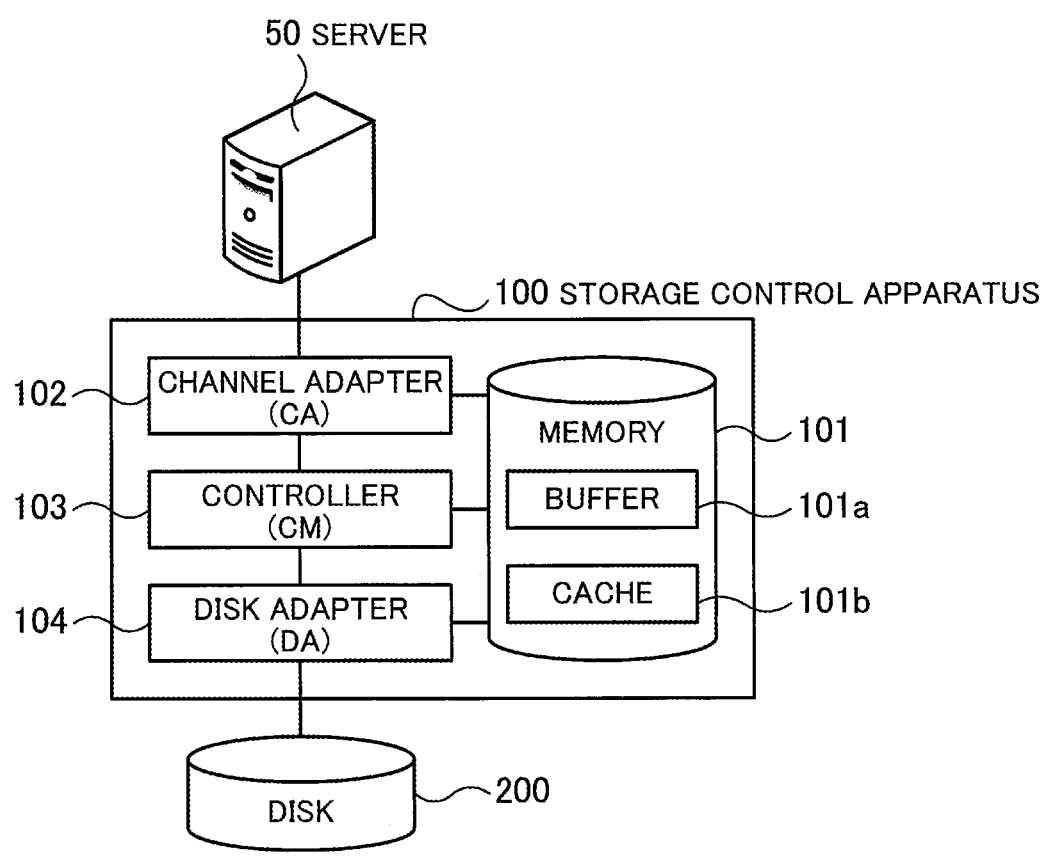
FIG. 5 illustrates an example of a storage system according to a second embodiment.

The storage system according to the second embodiment will be described with reference to FIG. 5. FIG. 5 illustrates an example of the storage system according to the second embodiment.

As illustrated in FIG. 5, the storage system according to the second embodiment includes a server 50, a storage control apparatus 100, and a disk 200. The storage control apparatus 100 and the disk 200 serve as a storage apparatus for storing the data used by the server 50.

Note that, although expressed as the "disk" here for convenience of description, a memory device, including a semiconductor memory device, such as an SSD, without a rotating mechanism may be used as the disk 200 or as a part of the disk 200. The disk 200 may be a disk array which is a combination of a plurality of HDDs, SSDs, and/or the like. The server 50, storage control apparatus 100, and disk 200 are connected by communication lines, such as a LAN (Local Area Network) and/or an FC (Fibre Channel), for example.

The server 50 is a computer including a processor, such as a CPU, a volatile memory, such as a RAM, and a nonvolatile memory, such as an HDD or an SSD. The server 50 performs the processing specified by an application program stored in a nonvolatile memory by means of a processor, a volatile memory, and the like, for example. The server 50 instructs the storage control apparatus 100 to perform data write processing and data read processing. The storage control apparatus 100 controls, in response to the read and write requests received from the server 50, to read/write data from/to the disk 200.

(Hardware)

Here, the hardware of the storage control apparatus 100 will be described.

As illustrated in FIG. 5, the storage control apparatus 100 includes a memory 101, a channel adapter 102, a controller 103, and a disk adapter 104. Hereinafter, the channel adapter 102 may be designated as a CA, the controller 103 as a CM, and the disk adapter 104 as a DA.

The memory 101 is a device having a faster write and read speed as compared with the disk 200. The memory 101 includes a memory area serving as a buffer 101a and a memory area serving as a cache 101b. The data received by the channel adapter 102 from the server 50 and the data transmitted to the server 50 from the channel adapter 102 are temporally stored in the buffer 101a. The data to be written into the disk 200 is temporally stored in the cache 101b. Note that, the memory used as the buffer 101a and the memory used as the cache 101b may be separated.

The channel adapter 102 is a communication adapter which exchanges data and control signals between the channel adapter 102 and the server 50. Moreover, the channel adapter 102 includes a CPU capable of executing operations, such as calculation of a CRC code. The controller 103 includes a RAM and a CPU capable of executing processing, such as a program for controlling the operation of the storage control apparatus 100. The disk adapter 104 is a connection adapter connected to the disk 200. Moreover, the disk adapter 104 includes a CPU capable of executing operations, such as check calculation of a CRC code.

(2-2. Functions)

Next, the functions of the channel adapter 102, controller 103, and disk adapter 104 will be described.

(2-2-1. Function of Channel Adapter 102)

First, the function of the channel adapter 102 will be described.

(During Writing)

The channel adapter 102 generates a CRC code on the basis of the data received from the server 50. Moreover, the channel adapter 102 adds to the data a check code including the generated CRC code and the positional information about a write destination of the data. Then, the channel adapter 102 stores into the buffer 101a the data with the check code added thereto. Hereinafter, a check code added to the data, which is stored in the buffer 101a, may be designated as Code (L), and a CRC code included in the Code (L) as CRC (L). Note that, the server 50 may add the Code (L) to the data.

(During Reading)

The channel adapter 102 reads from the buffer 101a the data with the Code (L) added thereto, and detects an error in the data using the CRC (L) included in the Code (L). When any error has not been detected, the channel adapter 102 removes the Code (L) from the data, and transmits the resulting data to the server 50. When an error has been detected, the channel adapter 102 notifies the server 50 of the read error in the data.

In the foregoing, the function of the channel adapter 102 has been described.

(2-2-2. Function of Controller 103)

Figure 6:
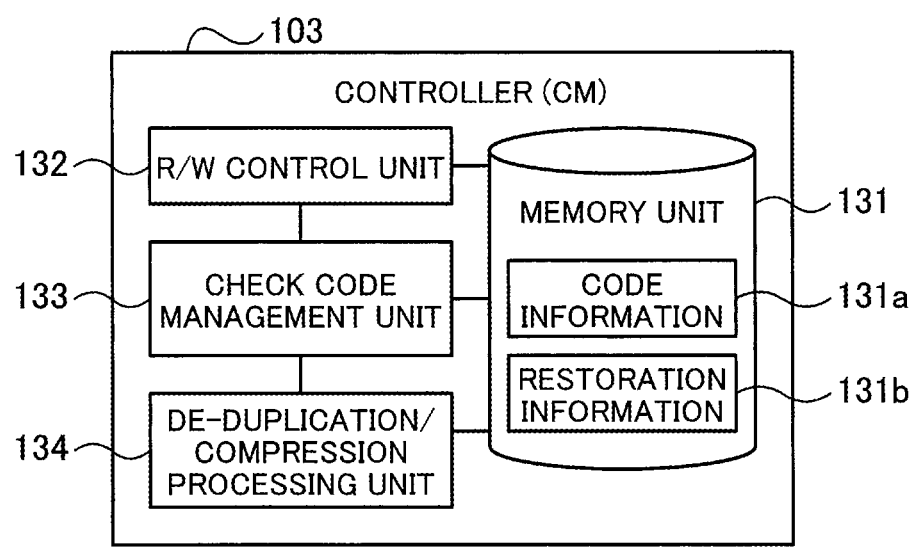
FIG. 6 illustrates an example of the function of a controller according to the second embodiment.

Next, the function of the controller 103 will be described with reference to FIG. 6. FIG. 6 illustrates an example of the function of the controller according to the second embodiment.

As illustrated in FIG. 6, the controller 103 includes a memory unit 131, an R/W control unit 132, a check code management unit 133, and a de-duplication/compression processing unit 134. Note that, the function of the memory unit 131 may be realized using a RAM, an HDD, and/or the like. The functions of the R/W control unit 132, check code management unit 133, and de-duplication/compression processing unit 134 may be realized using a CPU and the like.

Code information 131a and restoration information 131b are stored into the memory unit 131. The code information 131a includes the Code (L) added to the data, which is read out from the buffer 101a, and the information for identifying a relationship between the Code (L) and the data. The restoration information 131b is the information for identifying the remaining data having the same content as the data that is excluded by de-duplication. The R/W control unit 132 controls to read/write data from/to the disk 200 via the disk adapter 104.

(During Writing)

The check code management unit 133 reads out from the buffer 101a the data with the Code (L) added thereto, and detects an error in the data using the CRC (L) included in the Code (L).

When an error has been detected, the check code management unit 133 notifies the server 50 of the write error via the channel adapter 102. When an error has not been detected, the check code management unit 133 removes the Code (L) from the data, and stores the removed Code (L) into the memory unit 131 as the code information 131a. The check code management unit 133 inputs to the de-duplication/compression processing unit 134 the data from which the Code (L) has been removed.

The de-duplication/compression processing unit 134 de-duplicates the data input from the check code management unit 133 (see FIG. 2). As the method for de-duplication, for example, a method targeted for a set of data read from the buffer 101a or a method targeted for a set of data including the data of the buffer 101a, the data of the cache 101b, and the data of the disk 200 may be applicable.

The de-duplication/compression processing unit 134 compresses the data remaining after de-duplication to generate compressed data. Then, the de-duplication/compression processing unit 134 divides the compressed data into the divided data of a unit size, and calculates a CRC code based on the divided data. Moreover, the de-duplication/compression processing unit 134 generates a check code including the calculated CRC code and the positional information about a write destination of the divided data. Hereinafter, the CRC code calculated by the de-duplication/compression processing unit 134 may be designated as CRC (P), and a check code including the CRC (P) as Code (P).

Note that, the positional information about a write destination included in the Code (P) includes the information for identifying a location on the disk 200 at which the divided data is written. For example, this positional information includes the initial address and offset of a write destination in the physical area of the disk 200. That is, the positional information included in the Code (L) differs from the positional information included in the Code (P).

The de-duplication/compression processing unit 134 adds the generated Code (P) to the divided data. Then, the de-duplication/compression processing unit 134 writes into the cache 101b the divided data with the Code (P) added thereto. Then, the de-duplication/compression processing unit 134 notifies the server 50 of write completion of data via the channel adapter 102. Note that, a timing of the notification of write completion of data may be a time point when the writing to the disk 200 is complete.

(During Reading)

When the controller 103 receives a read request (READ request) of data from the server 50, the de-duplication/compression processing unit 134 identifies the divided data to be read from the cache 101b and/or the disk 200. When the data specified by the READ request is already de-duplicated during writing, the de-duplication/compression processing unit 134 identifies all the divided data of the data used for restoration, with reference to the restoration information 131b.

When there is the divided-data which has been identified in the cache 101b, the de-duplication/compression processing unit 134 reads out the divided-data which has been identified from the cache 101b.

When there is the divided-data which has been identified in the disk 200, the de-duplication/compression processing unit 134 reads out the divided-data which has been identified from the disk 200 via the R/W control unit 132. At this time, an error in the divided data, which is read out from the disk 200, may be notified from the disk adapter 104. In this case, the de-duplication/compression processing unit 134 notifies the server 50 of the read error via the channel adapter 102.

When all the divided-data which have been identified have been successfully read out, the de-duplication/compression processing unit 134 obtains the CRC (P) from the Code (P) added to the divided data which have been read out, and detects an error in the divided data.

When an error has been detected, the de-duplication/compression processing unit 134 notifies the server 50 of the read error via the channel adapter 102. When an error has not been detected, the de-duplication/compression processing unit 134 removes the Code (P) from the divided data. Then, the de-duplication/compression processing unit 134 combines the divided data to restore compressed data, and expands the compressed data to restore the data prior to de-duplication, based on the restoration information 131b.

The check code management unit 133 obtains the Code (L), which has been stored in the memory unit 131 as the code information 131a, and adds the Code (L) to the data restored by the de-duplication/compression processing unit 134. Then, the check code management unit 133 writes into the buffer 101a the data with the Code (L) added thereto.

In the foregoing, the function of the controller 103 has been described.

(2-2-3. Function of Disk Adapter 104)

Next, the function of the disk adapter 104 will be described.

(During Writing)

When a predetermined write condition has been satisfied, the disk adapter 104 reads out from the cache 101b the data with a Code (P) added thereto. The write condition is, for example, that a period of time elapsed after data is written into the cache 101b exceeds a predetermined threshold, or that the free space of the cache 101b falls below a prescribed capacity, or so on.

The disk adapter 104 obtains a CRC (P) from the Code (P) added to the data that has been read out from the cache 101b. Then, the disk adapter 104 detects an error in the data on the basis of the obtained CRC (P). When an error has not been detected, the disk adapter 104 writes into the disk 200 the data with the Code (P) added thereto. When an error has been detected, the disk adapter 104 notifies the controller 103 of an error in the data read out from the cache 101b.

(During Reading)

The disk adapter 104 reads out from the disk 200 the data with the Code (P) added thereto. The disk adapter 104 obtains a CRC (P) included in the Code (P) that is added to the read data. Then, the disk adapter 104 detects an error in the data on the basis of the obtained CRC (P).

When an error has not been detected, the disk adapter 104 writes into the cache 101b the data with the Code (P) added thereto. When an error has been detected, the disk adapter 104 notifies the controller 103 of an error in the read data.

In the foregoing, the function of the disk adapter 104 has been described.

(2-2-4. Write Processing #1

Figure 7:
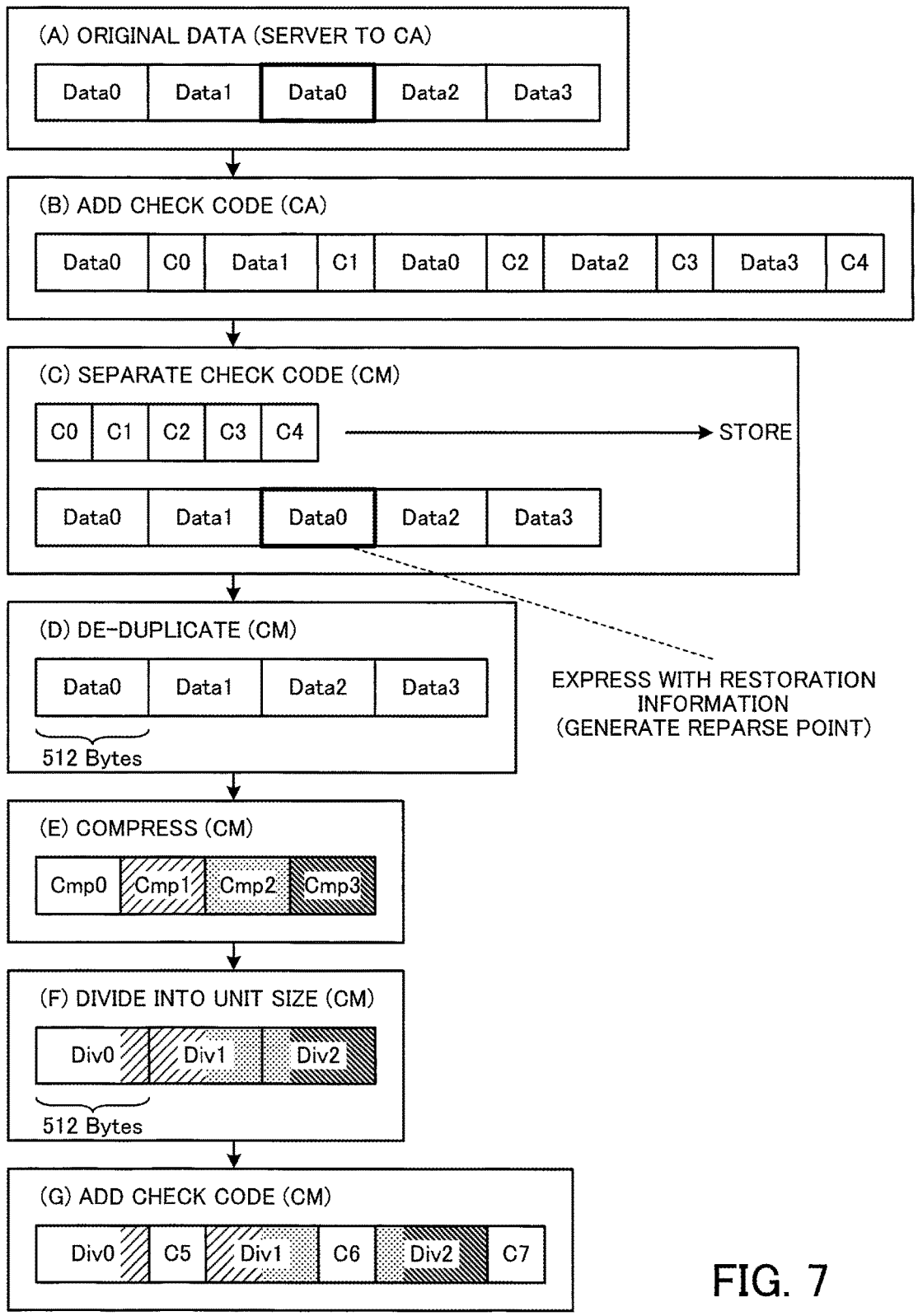
FIG. 7 illustrates an example of the write processing performed by the storage control apparatus according to the second embodiment.

Here, the content of the processing related to the management of a check code during the writing of data will be further described with reference to FIG. 7. FIG. 7 illustrates an example of the write processing performed by the storage control apparatus according to the second embodiment.

In the example of (A) of FIG. 7, the data (original data), which is input to the channel adapter 102 together with a write request (WRITE request) from the server 50, includes Data0, Data1, Data0, Data2, and Data3. In this original data, the portions of Data0 are duplicated. As illustrated in (B) of FIG. 7, the channel adapter 102 adds the check codes C0, C1, C2, C3, and C4 to the Data0, Data1, Data0, Data2, and Data3, respectively. C0, C1, C2, C3, and C4 are an example of the Code (L).

As described above, the addition of the check codes C0, C1, C2, C3, and C4 enables detection of an error in data which may occur in the section (section including wirings, circuits, and the buffer 101a) from the channel adapter 102 to the controller 103.

Next, the check code management unit 133 of the controller 103 separates the check codes C0, C1, C2, C3, and C4 from the checked data, as illustrated in (C) of FIG. 7. Then, the check code management unit 133 stores the separated check codes C0, C1, C2, C3, and C4 into the memory unit 131 as the code information 131a.

Next, the de-duplication/compression processing unit 134 of the controller 103 performs de-duplication, as illustrated in (D) of FIG. 7. In this example, because the portions of Data0 are duplicated, one portion is left and all the other portions having the duplicated content are deleted. At this time, the restoration information 131b for identifying the portions deleted by de-duplication is generated (see (C) of FIG. 7).

Next, the de-duplication/compression processing unit 134 compresses the Data0, Data1, Data2, and Data3 remaining after de-duplication to generate compressed data Cmp0, Cmp1, Cmp2, and Cmp3, respectively, as illustrated in (E) of FIG. 7. Then, the de-duplication/compression processing unit 134 divides a set of the compressed data into each unit size (in this example, 512 bytes corresponding to a specified size of an I/O command to a physical memory device, such as an HDD) to generate divided data Div0, Div1, and Div2 each having the unit size.

Next, the check code management unit 133 calculates a CRC code from each of the Div0, Div1, and Div2 and generates the check codes C5, C6, and C7 each including the calculated CRC code, as illustrated in (G) of FIG. 7. Then, the check code management unit 133 adds the check codes C5, C6, and C7 to the Div0, Div1, and Div2, respectively. Note that, the check codes C5, C6, and C7 are an example of the Code (P).

As described above, the addition of the check codes C5, C6, and C7 enables detection of an error in data which may occur in the section (section including wirings, circuits, the cache 101b, and the disk 200) from the controller 103 to the disk 200.

(2-2-5. Write processing #2: Variant)

Figure 8:
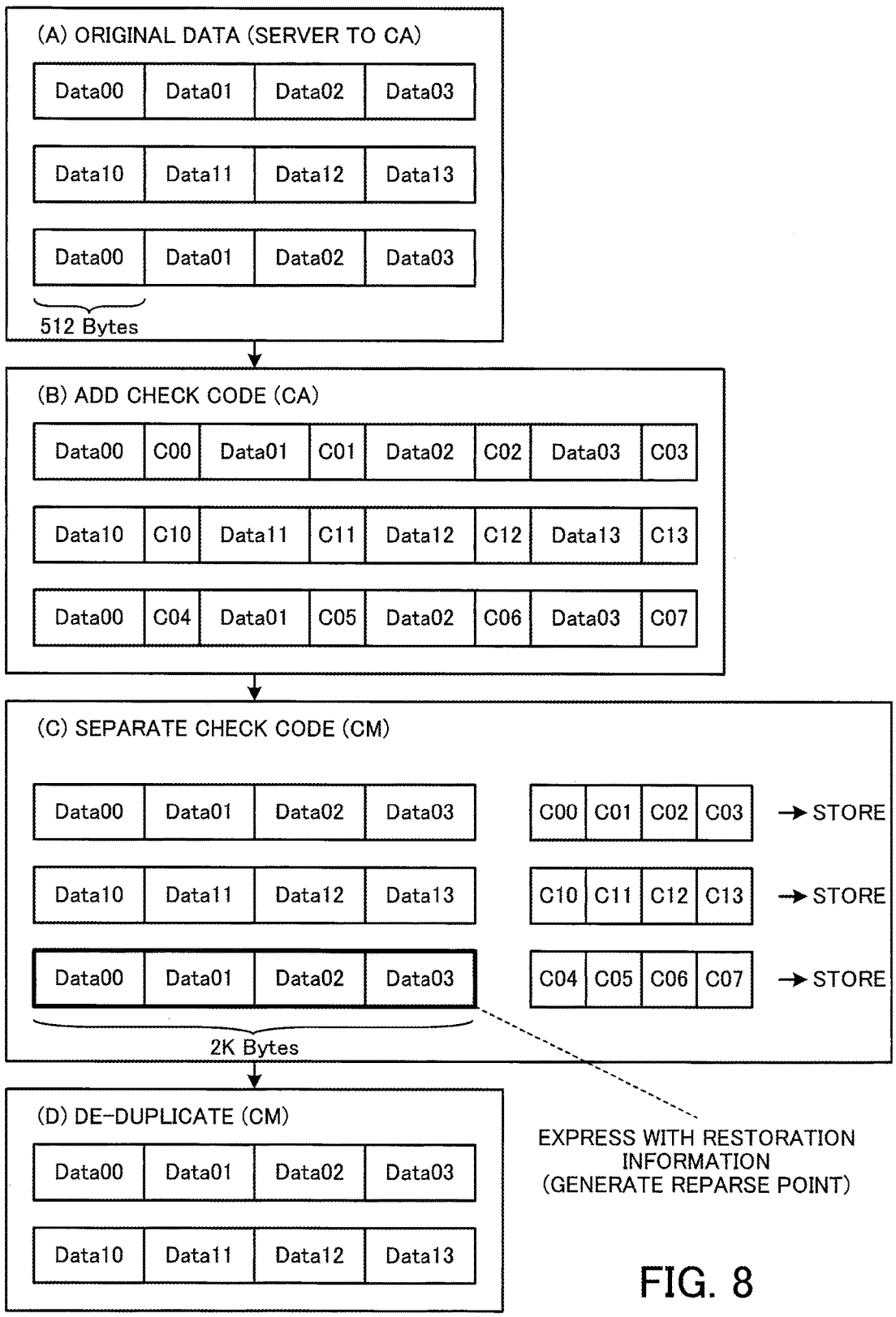
FIG. 8 illustrates one variant (part 1) of the write processing performed by the storage control apparatus according to the second embodiment.
Figure 9:
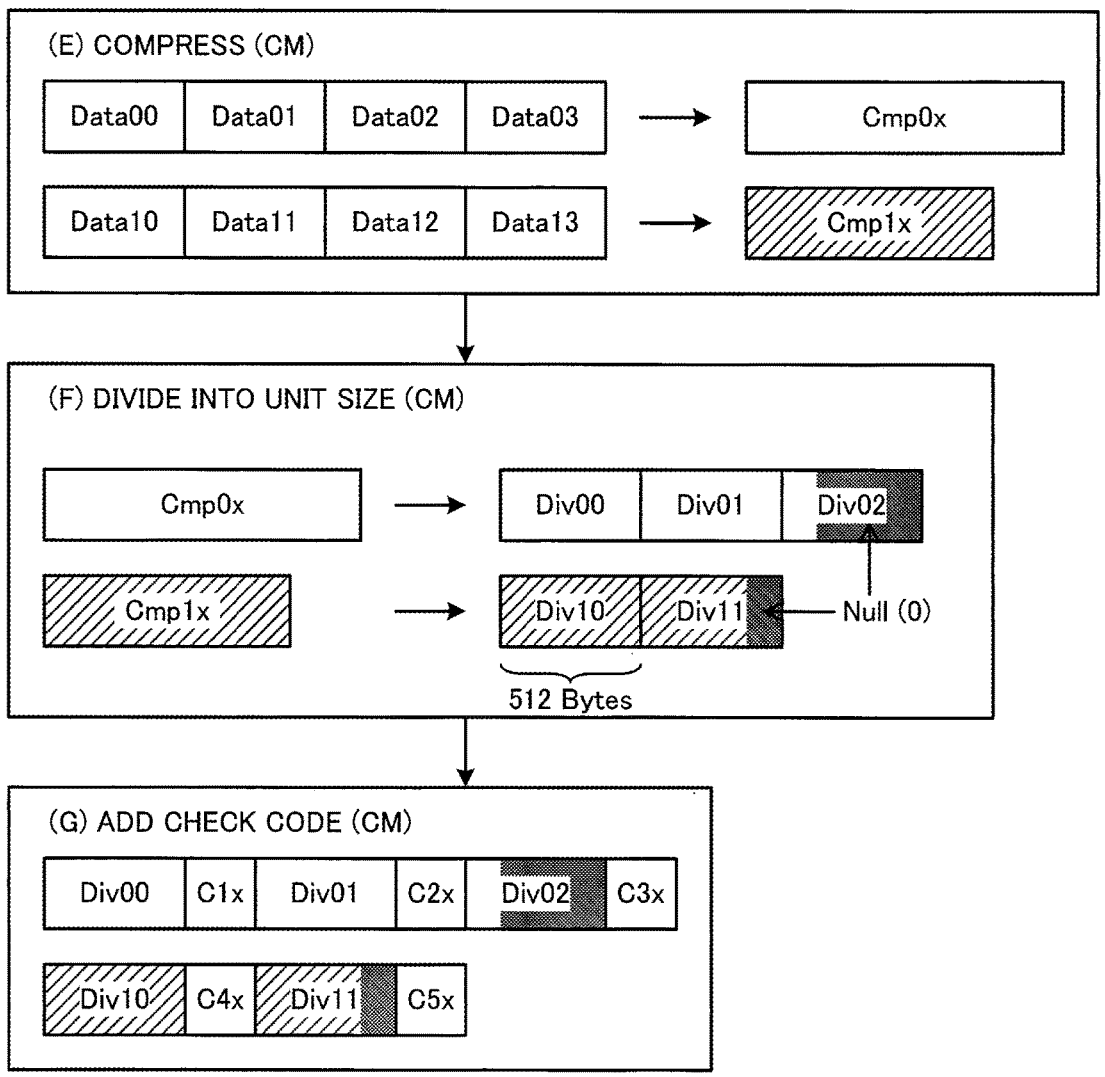
FIG. 9 illustrates the one variant (part 2) of the write processing performed by the storage control apparatus according to the second embodiment.

In the example of FIG. 7, de-duplication is performed on the basis of the unit size of the data written into the disk 200, while as illustrated in FIG. 8, de-duplication may be performed on the basis of data with a size larger than the unit size. Moreover, as illustrated in FIG. 9, in order for a plurality of pieces of compressed data not to be mixed within one piece of divided data (see (F) of FIG. 7), divided data may be generated for each piece of the compressed data. Here, these variants will be described.

FIG. 8 illustrates one variant (part 1) of the write processing performed by the storage control apparatus according to the second embodiment. FIG. 9 illustrates the one variant (part 2) of the write processing performed by the storage control apparatus according to the second embodiment.

An example of FIG. 8 illustrates a case where two pieces of original data each including Data00, Data01, Data02, and Data03 and one original data including Data10, Data11, Data12, and Data13 are input to the controller 103, as illustrated in (A) of FIG. 8. That is, Data00, Data01, Data02, and Data03 are duplicated.

The channel adapter 102 calculates the CRC code for each of two sets of Data00, . . . , Data03 and one set of Data10, . . . , Data13, as illustrated in (B) of FIG. 8. Then, the channel adapter 102 generates the check codes C00, . . . , C07 and C10, . . . , C13 each including the calculated CRC code, and adds the check codes to two sets of Data00, . . . , Data03 and one set of Data10, . . . , Data 13, respectively. Note that, C00, . . . , C07 and C10, . . . , C13 are examples of the Code (L).

As described above, the addition of the check codes C00, . . . , C07 and C10, . . . , C13 enables detection of an error in data which may occur in the section (section including wirings, circuits, and the buffer 101a) from the channel adapter 102 to the controller 103.

Next, the check code management unit 133 of the controller 103 separates the check codes C00, . . . , C07 and C10, . . . , C13 from the checked data, as illustrated in (C) of FIG. 8. Then, the check code management unit 133 stores the separated check codes C00, . . . , C07 and C10, . . . , C13 into the memory unit 131 as the code information 131a.

Next, the de-duplication/compression processing unit 134 of the controller 103 performs de-duplication, as illustrated in (D) of FIG. 8. At this time, the de-duplication/compression processing unit 134 performs the de-duplication on the basis of a size (2K bytes in this example) larger than the unit size (512 bytes in this example). In the example of FIG. 8, because a set of Data00, . . . , Data03 having a total size of 2K bytes is duplicated, one set is left and all the other sets each having the duplicated content are deleted. At this time, the restoration information 131b for identifying the set deleted by de-duplication is generated (see (C) of FIG. 8).

Next, the de-duplication/compression processing unit 134 compresses each of the set of Data00, . . . , Data03 and set of Data10, . . . , Data13 remaining after de-duplication to generate compressed data Cmp0x and Cmp1x, respectively, as illustrated in (E) of FIG. 9. Then, the de-duplication/compression processing unit 134 divides each of the compressed data Cmp0x and Cmp1x into unit size (512 bytes in this example), as illustrated in (F) of FIG. 9.

For example, when the compressed data Cmp0x is divided into divided data Div00, Div01, and Div02 as illustrated in (F) of FIG. 9, a part of the divided data Div02 may have a size smaller than the unit size. In this case, the de-duplication/compression processing unit 134 adds Null data (data of the value 0) to the divided data Div02 to adjust the size of the divided data Div02 so as to be the unit size. The same applies to the divided data Div11 obtained by dividing the compressed data Cmp1.

Next, the check code management unit 133 calculates CRC from each of the Div00, . . . , Div02, Div10, and DiV11 and generates the check codes C1x, . . . , C5x each including the calculated CRC, as illustrated in (G) of FIG. 9. Then, the check code management unit 133 adds the check codes C1x, . . . , C5x to Div00, . . . , Div02, Div10, and Div11, respectively. Note that, the check codes C1x, . . . , C5x are examples of the Code (P).

As described above, the addition of the check codes C1x, . . . , C5x enables detection of an error in data which may occur in the section (section including wirings, circuits, the cache 101b, and the disk 200) from the controller 103 to the disk 200. Moreover, because the relationship between the divided data and the set to be de-duplicated becomes one-to-one basis, the series of processing performed for identifying and obtaining the data, which is used in restoring the data prior to de-duplication, may be streamlined.

In the foregoing, the functions of the channel adapter 102, controller 103, and disk adapter 104 have been described.

(2-3. Processing Flow)

Next, processing flows will be described.

(Write Operation)

Figure 10:
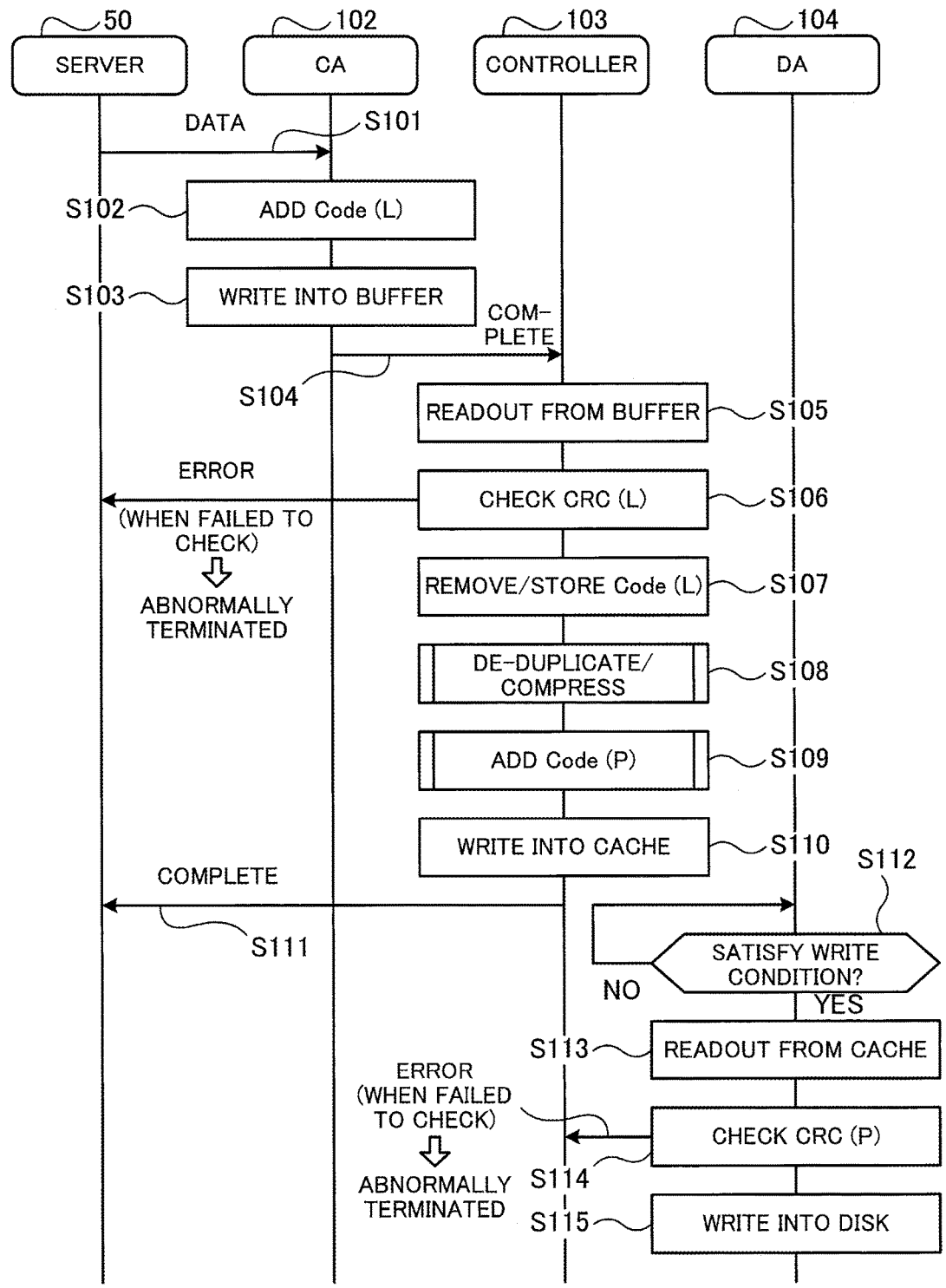
FIG. 10 is a sequence diagram illustrating a flow of the processing of writing data in a storage system according to the second embodiment.

First, a write processing flow will be described with reference to FIG. 10. FIG. 10 is a sequence diagram illustrating a flow of the processing of writing data in the storage system according to the second embodiment.

(S101) The channel adapter 102 receives a WRITE request from the server 50, and obtains the data specified by the WRITE request.

(S102) The channel adapter 102 calculates a CRC code (CRC (L)) on the basis of the data obtained from the server 50, and generates a check code (Code (L)) including the calculated CRC (L) and the positional information about a write destination of the data. Then, the channel adapter 102 adds the generated Code (L) to the data.

(S103, S104) The channel adapter 102 writes into the buffer 101a the data with the Code (L) added thereto. Then, the channel adapter 102 inputs to the controller 103 a notification that the writing to the buffer 101a is complete.

(S105) The check code management unit 133 of the controller 103 reads out from the buffer 101a the data to be written to which the Code (L) is added.

(S106) The check code management unit 133 obtains the CRC (L) from the Code (L) added to the read data. Then, the check code management unit 133 checks if there is an error in the data, using the obtained CRC (L). When there is an error in the data, the check code management unit 133 notifies the server 50 of the writing error via the channel adapter 102 and abnormally terminates the write processing. On the other hand, when there is no error in the data, the process proceeds to S107.

(S107) The check code management unit 133 removes the Code (L) from the data, and stores the removed Code (L) into the memory unit 131 as the code information 131a.

(S108) The de-duplication/compression processing unit 134 of the controller 103 performs de-duplication on the data from which Code (L) has been removed by the check code management unit 133.

For example, the de-duplication/compression processing unit 134 refers to the data in the buffer 101a, cache 101b, and disk 200, and when there is the data having a duplicated content, deletes the duplicated portion of the data to be written. Then, the de-duplication/compression processing unit 134 generates the restoration information 131b for identifying the data having the same content as the deleted duplicated portion.

Moreover, the de-duplication/compression processing unit 134 compresses the data to be written, which has remained after the de-duplication, to generate the compressed data (e.g., see (E) of FIG. 9). Then, the de-duplication/compression processing unit 134 divides the compressed data into unit size to generate the divided data (e.g., see (F) of FIG. 9).

(S109) The check code management unit 133 calculates a CRC code (CRC (P)) on the basis of the divided data, and generates a check code (Code (P)) including the calculated CRC (P) and the positional information about a write destination of the divided data. Then, the check code management unit 133 adds the generated Code (P) to the divided data.

(S110, S111) The check code management unit 133 writes into the cache 101b the divided data with the Code (P) added thereto. Then, the check code management unit 133 transmits to the server 50 a notification that the writing of the data is complete, via the channel adapter 102. That is, at the timing when the writing to the cache 101b is complete, a completion response to the WRITE request is notified to the server 50.

(S112) The disk adapter 104 determines whether or not a write condition set in advance has been satisfied. The write condition is, for example, that a period of time elapsed after data is written into the cache 101b exceeds a predetermined threshold, or that the free space of the cache 101b falls below a prescribed capacity, or so on. When the write condition has been satisfied, the process proceeds to S113. When the write condition has not been satisfied yet, the determination processing of S112 is repeated.

(S113) The disk adapter 104 reads out from the cache 101b the data to be written into the disk 200.

For example, the disk adapter 104 reads out, among the data stored in the cache 101b, data, in which the time elapsed after being written exceeds a predetermined threshold, from the cache 101b as the data to be written into the disk 200. Moreover, the disk adapter 104 may select the data to be written into the disk 200, in order from the older data or in order from the data less frequently read, and read out the selected data from the cache 101b.

(S114) The disk adapter 104 obtains a CRC (P) from the Code (P) added to the data read out from the cache 101b. Then, the disk adapter 104 checks if there is an error in the data using the obtained CRC (P). When there is an error in the data, the disk adapter 104 notifies the controller 103 of the writing error. When there is no error in the data, the process proceeds to S115.

(S115) The disk adapter 104 writes into the disk 200 the data with the Code (P) added thereto. Upon completion of the processing of S115, the series of processing illustrated in FIG. 10 is successfully terminated. Note that, the completion notification in response to the WRITE request may be notified to the server 50 at the timing when the writing to the disk 200 is complete.

(De-Duplication/Compression Processing)

Figure 11:
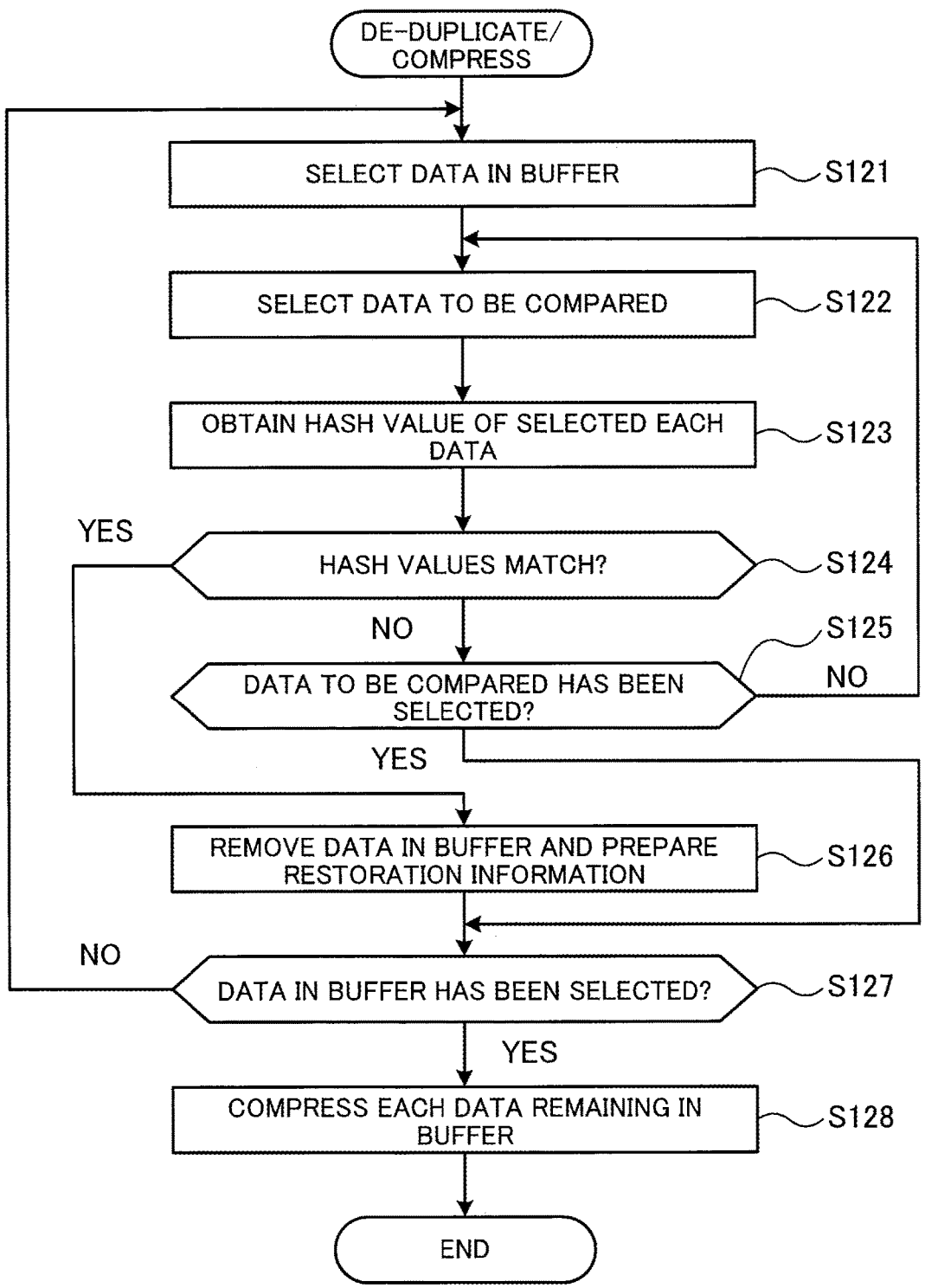
FIG. 11 is a flow chart illustrating a flow of the de-duplication/compression processing performed by the controller according to the second embodiment.

Here, the de-duplication/compression processing will be further described with reference to FIG. 11. FIG. is a flow chart illustrating a flow of the de-duplication/compression processing performed by the controller according to the second embodiment.

(S121) The de-duplication/compression processing unit 134 of the controller 103 selects from among the data in the buffer 101a one piece of data to be de-duplicated.

(S122) The de-duplication/compression processing unit 134 selects one piece of data to be compared for determining whether or not to de-duplicate as compared with the data selected in S121. For example, the de-duplication/compression processing unit 134 selects the data to be compared from among the data in the buffer 101a, cache 101b, and disk 200.

(S123) The de-duplication/compression processing unit 134 obtains the hash value of each data selected in S121 and S122. Note that, the de-duplication/compression processing unit 134 may calculate the hash value from data every time it selects the data, or may store a pre-calculated hash value in the memory unit 131 and obtain the pre-calculated hash value from the memory unit 131 in using the same.

(S124) The de-duplication/compression processing unit 134 determines whether or not two hash values obtained in S123 match. When two hash values match, the process proceeds to S126. As the hash value, SHA (Secure Hash Algorithm)-1 and the like may be used, for example.

Matching of the hash values means the matching of the data used for the calculation thereof. On the other hand, when two hash values do not match, the process proceeds to S125.

(S125) The de-duplication/compression processing unit 134 determines whether or not the data to be compared has been selected in the processing of S122. When the data to be compared has been selected, the process proceeds to S127. On the other hand, when there is any unselected data to be compared, the process proceeds to S122.

(S126) The de-duplication/compression processing unit 134 removes the data in the buffer 101a, and prepares the restoration information 131b for identifying the data having the same content as the removed data. For example, as the restoration information 131b for identifying data stored in the cache 101b or the disk 200, an address or the like indicative of a storage location of the data may be used, for example. Moreover, as the restoration information 131b for identifying data in the buffer 101a, the positional information or the like included in the check code of the data may be used, for example.

(S127) The de-duplication/compression processing unit 134 determines whether or not the data in the buffer 101a has been selected in the processing of S121. When the data in the buffer 101a has been selected, the process proceeds to S128. On the other hand, when there is any unselected data in the buffer 101a, the process proceeds to S121.

(S128) The de-duplication/compression processing unit 134 compresses each data remaining in the buffer 101a after the de-duplication to generate the compressed data. Upon completion of the processing of S128, the series of processing illustrated in FIG. 11 is complete.

(Addition of Code (P))

Figure 12:
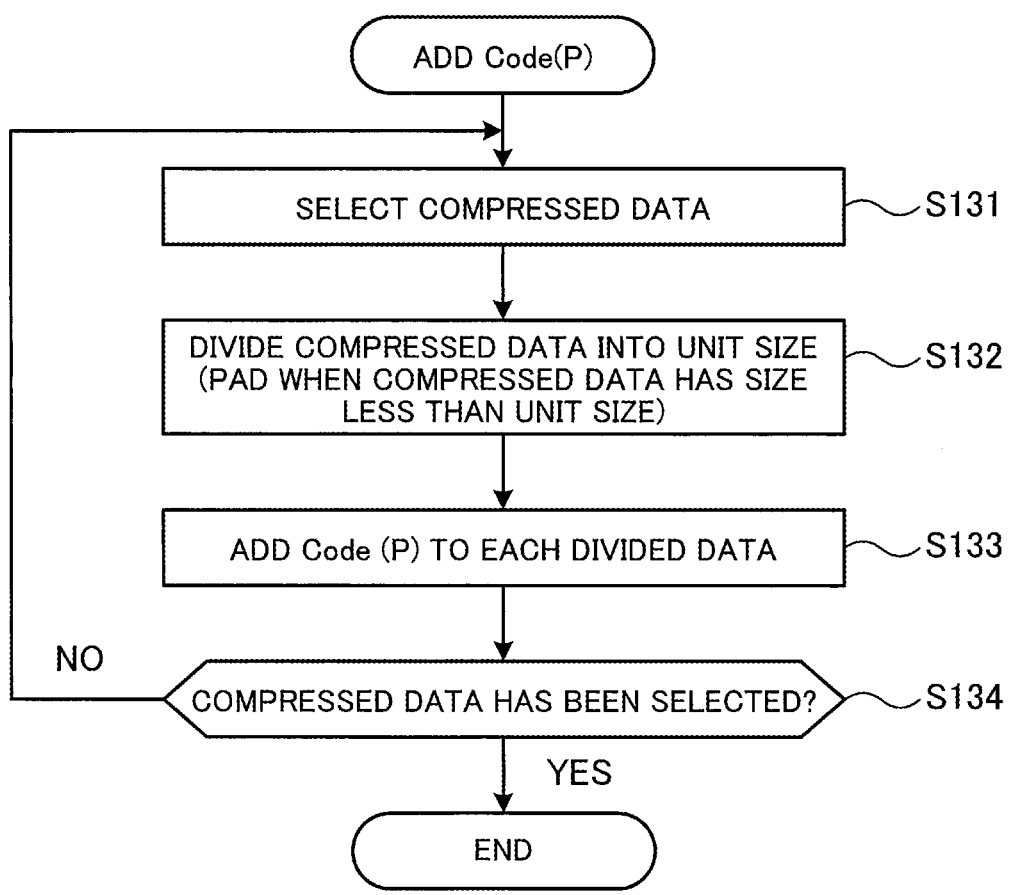
FIG. 12 is a flow chart illustrating a flow of the processing of adding a check code (Code (P)) performed by the controller according to the second embodiment.

Here, the processing of adding Code (P) will be further described with reference to FIG. 12. FIG. 12 is a flow chart illustrating a flow of the processing of adding the check code (Code (P)) performed by the controller according to the second embodiment.

(S131) The de-duplication/compression processing unit 134 of the controller 103 selects one piece of compressed data.

(S132) The de-duplication/compression processing unit 134 divides into the unit size the compressed data selected in S131 to generate the divided data. For example, the de-duplication/compression processing unit 134 adds Null data (data of the value 0) to the divided data having a size less than the unit size to adjusts (padding) the size of the divided data so as to be the unit size, as illustrated in (F) of FIG. 9.

(S133) The check code management unit 133 of the controller 103 calculates a CRC (P) from the divided data generated by the de-duplication/compression processing unit 134 to generate a Code (P) including the calculated CRC (P) and the positional information. Then, the check code management unit 133 adds the Code (P) to the divided data.

(S134) The de-duplication/compression processing unit 134 determines whether or not the compressed data has been selected. When the compressed data has been selected, the series of processing illustrated in FIG. 12 is complete. On the other hand, when there is an unselected compressed data, the process proceeds to S131.

(Readout Operation)

Figure 13:
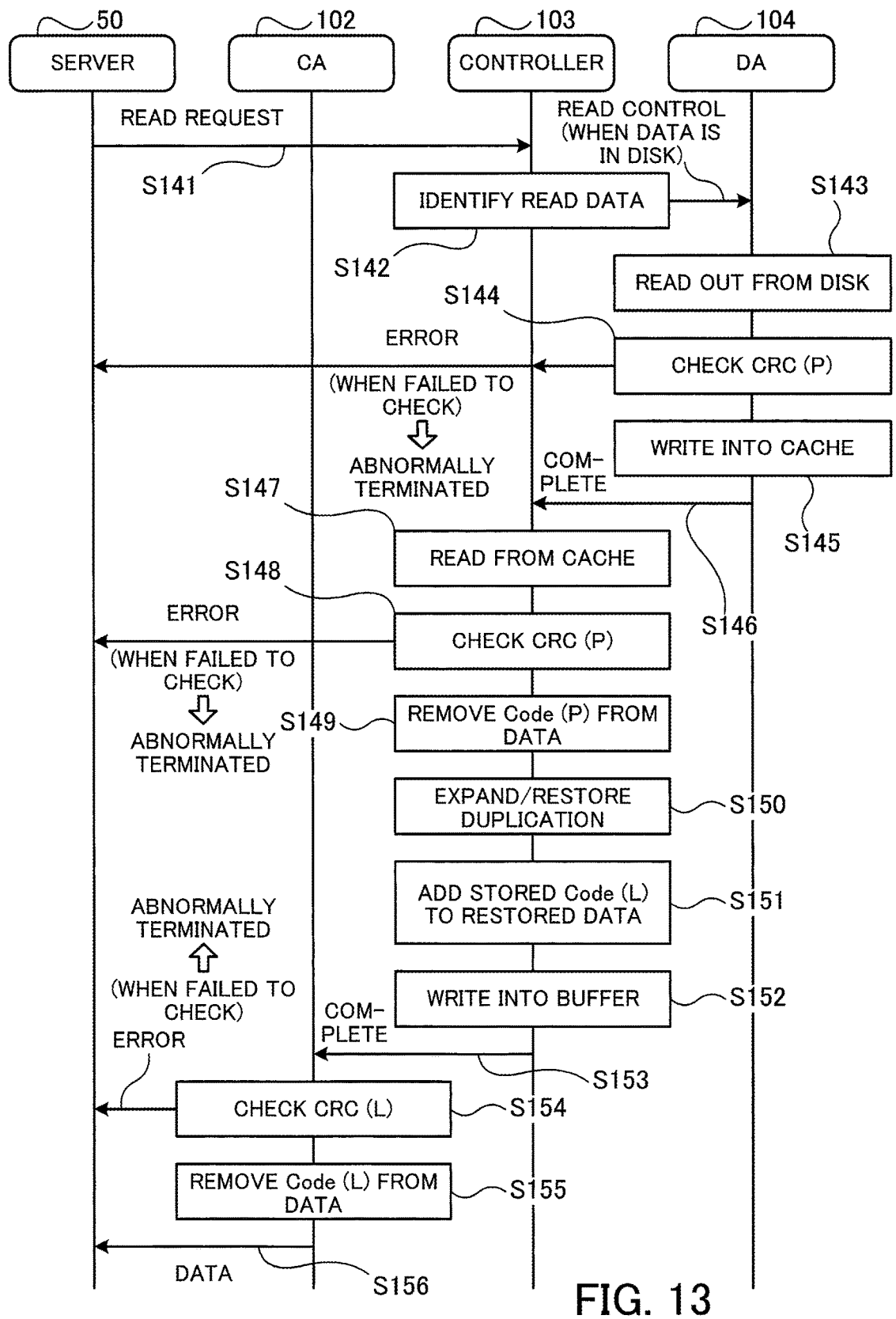
FIG. 13 is a sequence diagram illustrating a flow of the processing of readout in the storage system according to the second embodiment.

Next, the flow of the readout processing will be described with reference to FIG. 13. FIG. 13 is a sequence diagram illustrating a flow of the processing of readout in the storage system according to the second embodiment.

(S141) The controller 103 receives a READ request from the server 50 via the channel adapter 102.

(S142) The de-duplication/compression processing unit 134 of the controller 103 identifies the divided data to be read out from the cache 101b and/or disk 200 in order to obtain the data specified by the READ request.

When the divided data has been de-duplicated during writing, the de-duplication/compression processing unit 134 identifies all the divided data used for restoration, with reference to the restoration information 131b. Moreover, the de-duplication/compression processing unit 134 controls, when there is the divided-data which has been identified in the disk 200, the disk adapter 104 so as to read out the divided data from the disk 200 (READ control). In this case, the processing from S143 to S146 is performed.

(S143) The disk adapter 104 subjected to the READ control reads out the divided data, which is identified by the de-duplication/compression processing unit 134, from the disk 200. Note that, the read divided data has the Code (P) added thereto.

(S144) The disk adapter 104 obtains a CRC (P) from the Code (P) added to the read divided data, and checks if there is an error in the divided data, using the obtained CRC (P).

When there is an error in the divided data, the disk adapter 104 notifies the controller 103 of the read error. The controller 103 having received this error notifies the server 50 of the read error via the channel adapter 102, as a response to the READ request. In this case, the readout processing is abnormally terminated. On the other hand, when there is no error in the divided data, the process proceeds to S145.

(S145, S146) The disk adapter 104 writes into the cache 101b the divided data with a Code (P) added thereto. Then, the disk adapter 104 notifies the controller 103 that the writing to the cache 101b is complete.

(S147) The check code management unit 133 of the controller 103 reads out from the cache 101b all the divided data identified in S142.

(S148) The check code management unit 133 obtains the CRC (P) from the Code (P) added to each divided data that is read out from the cache 101b, and checks if there is an error in each divided data, using the obtained CRC (P). When the divided data including an error has been detected, the check code management unit 133 notifies the server 50 of the read error via the channel adapter 102. In this case, the readout processing is abnormally terminated. On the other hand, when the divided data including an error has not been detected, the process proceeds to S149.

(S149) The check code management unit 133 removes the Code (P) added to the divided data.

(S150) The de-duplication/compression processing unit 134 combines the divided data to restore compressed data, and expands the restored compressed data to restore the data prior to de-duplication.

Note that, because all the divided data corresponding to the data prior to de-duplication are identified in the processing of S142 and the compressed data are obtained on the basis of the divided data which has been identified, the data prior to de-duplication may be restored from the data that is obtained by expanding the compressed data. When there is divided data with the Null data padded thereto, the Null data is removed in restoring the compressed data.

(S151) The check code management unit 133 obtains the Code (L) that is stored as the code information 131a in the memory unit 131, and adds the Code (L) to the restored data prior to de-duplication.

(S152, S153) The check code management unit 133 writes into the buffer 101a the data with the Code (L) added thereto. Then, the check code management unit 133 notifies the channel adapter 102 that the data specified by the READ request has been written into the buffer 101a.

(S154) The channel adapter 102 obtains a CRC (L) from the Code (L) added to the data that is written into the buffer 101a, and checks if there is an error in the data, using the obtained CRC (L). When there is an error in the data, the channel adapter 102 notifies the server 50 of the read error. In this case, the readout processing is abnormally terminated. On the other hand, when there is no error in the data, the process proceeds to S155.

(S155, S156) The channel adapter 102 removes the Code (L) added to the data, and transmits to the server 50 the data from which the Code (L) has been removed, as a response to the READ request. Upon completion of the processing of S156, the series of processing illustrated in FIG. 13 is complete.

In the foregoing, the processing flow has been described. As described above, the addition/removal of Code (L) and Code (P) are performed at an appropriate timing taking into consideration the de-duplication, so that efficient de-duplication may be achieved without decreasing the reliability of data. Moreover, two types of independent check codes such as Code (L) and Code (P) are used, so that the reliability of the data in each section, in which the transmission and inputting/outputting of data occur, in the storage control apparatus 100 and the disk 200 may be maintained while performing de-duplication.

In the foregoing, the second embodiment has been described.

According to the embodiments discussed herein, the capacity efficiency of a memory device may be increased without decreasing the reliability.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention.

Although one or more embodiments of the present invention have been described in detail, it should be understood that various changes, substitutions, and alterations could be made hereto without departing from the spirit and scope of the invention.

What is claimed is:

1. A storage control apparatus comprising a processor and a connector that connects to a memory device, the processor configured to perform a procedure including:

receiving first data sets, each having a data body and first code information, the first code information including a first error detection code on the data body and information about a first write destination;

separating each of the received first data sets into the data body and the first code information;

eliminating redundant data bodies in duplication of separated data bodies separated from the received first data sets;

generating second code information which includes a second error detection code and information about a second write destination, for each of remaining data bodies remaining after the eliminating; and outputting second data sets to the memory device via the connector, the second data sets each having one of the remaining data bodies and the second code information corresponding to the one remaining data body.

2. The storage control apparatus according to claim 1, further comprising a memory configured to store the first code information, wherein the procedure further includes storing, into the memory, the first code information excluded from the received first data sets, and in readout processing, using the first code information stored in the memory, when restoring the received first data sets based on the second data sets read out from the memory device.

3. The storage control apparatus according to claim 1, wherein the procedure further includes compressing each of the remaining data bodies to generate compressed data bodies and dividing the compressed data bodies into divided data bodies each having a predetermined size, and when a size of a portion generated from the compressed data bodies by the dividing is smaller than the predetermined size, adding predetermined data to the portion so as to generate each of the divided data bodies of the predetermined size, and generating the second code information based on said each of the divided data bodies.

4. A non-transitory computer-readable storage medium storing a computer program that causes a computer connecting to a memory device via a connector to perform a procedure comprising:

receiving first data sets, each having a data body and first code information, the first code information including a first error detection code on the data body and information about a first write destination;

separating each of the received first data sets into the data body and the first code information;

eliminating redundant data bodies in duplication of separated data bodies separated from the received first data sets;

generating second code information which includes a second error detection code and information about a second write destination, for each of remaining data bodies remaining after the eliminating; and outputting second data sets to the memory device via the connector, the second data sets each having one of the remaining data bodies and the second code information corresponding to the one remaining data body.

5. The non-transitory computer-readable storage medium according to claim 4, wherein the procedure further includes: storing the first code information excluded from the received first data sets, and in readout processing, using the first code information, when restoring the received first data sets based on the second data sets read out from the memory device.

6. The non-transitory computer-readable storage medium according to claim 4, wherein the procedure further includes compressing each of the remaining data bodies to generate compressed data bodies and dividing the compressed data bodies into divided data bodies of a predetermined size, and when a size of a portion generated from the compressed data bodies by the dividing is smaller than the predetermined size, adding predetermined data to the portion so as to generate each of the divided data bodies of the predetermined size, and generating the second code information based on said each of divided data bodies.

* * * * *